United States Patent
Mizushima et al.

(10) Patent No.: US 8,742,391 B2
(45) Date of Patent: Jun. 3, 2014

(54) NON-VOLATILE SEMICONDUCTOR MEMORY

(71) Applicant: Kabushiki Kaisha Toshiba, Tokyo (JP)

(72) Inventors: Ichiro Mizushima, Kanagawa (JP); Hirotaka Ogihara, Kanagawa (JP); Kensuke Takahashi, Kanagawa (JP); Masanobu Baba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/788,596

(22) Filed: Mar. 7, 2013

(65) Prior Publication Data

US 2013/0270506 A1    Oct. 17, 2013

(30) Foreign Application Priority Data

Mar. 23, 2012    (JP) ................ P2012-068438

(51) Int. Cl.
H01L 47/00    (2006.01)
(52) U.S. Cl.
USPC ............................................. 257/4
(58) Field of Classification Search
USPC ................................................ 257/4
See application file for complete search history.

(56) References Cited

U.S. PATENT DOCUMENTS

| | | | |
|---|---|---|---|
| 2006/0092685 | A1 | 5/2006 | Ootsuka et al. |
| 2009/0014770 | A1 | 1/2009 | Terao et al. |
| 2011/0069533 | A1 | 3/2011 | Kurosawa et al. |
| 2011/0194329 | A1 | 8/2011 | Ohba et al. |

FOREIGN PATENT DOCUMENTS

| | | |
|---|---|---|
| JP | 2007-329273 | 12/2007 |
| JP | 20071329273 A | 12/2007 |
| JP | 2010-177654 | 8/2010 |
| JP | 2010-212541 | 9/2010 |

OTHER PUBLICATIONS

E.F. Kennedy et al. "Influence of 16O, 12C, 14N, and noble gases on the crystallization of amorphous Si layers" Journal of Applied Physics, vol. 48, No. 10, Oct. 1977, pp. 4241-4246.

*Primary Examiner* — Marvin Payen
(74) *Attorney, Agent, or Firm* — Patterson + Sheridan LLP.

(57) ABSTRACT

A non-volatile semiconductor memory includes a word line extending in a first direction, a first electrode connected to the word line electrically, an ion diffusion layer with connected to the first electrode electrically, a second electrode connected to the ion diffusion layer electrically and formed of a metal to be diffused into the ion diffusion layer when a positive voltage is supplied thereto, and a bit line extending in a second direction perpendicular to the first direction, the bit line connected to the second electrode electrically. The ion diffusion layer has a first region disposed on the first electrode and a second region disposed between the first region and the second electrode, and the metal is more difficult to diffuse into the second region than into the first region.

20 Claims, 8 Drawing Sheets

NON-VOLATILE SEMICONDUCTOR MEMORY

CROSS-REFERENCE TO RELATED APPLICATION

This application is based upon and claims the benefit of priority from Japanese Patent Application No. 2012-068438, filed Mar. 23, 2012; the entire contents of which are incorporated herein by reference.

FIELD

Embodiments described herein relate to a non-volatile semiconductor memory including CBRAM (conductive-bridging random access memory).

BACKGROUND

Many non-volatile semiconductor memory devices incorporate NAND flash memory cells. The NAND flash memory cell includes a charge-storage transistor including a charge-storage layer formed on an insulation film between a channel layer and a gate electrode. When charges accumulate in the charge-storage layer, the threshold voltage of the charge-storage transistor may be changed, as a result of which, information may be read in and out. For high-capacity, it is necessary to further refine the charge-storage transistor but the insulation film is thinned, which increases the leakage current and weakens the charge holding capacity. As a result, it is more and more difficult to use the charge-storage transistor for high-capacity.

In a CBRAM, at the cross-point of word lines (WLs) and bit lines (BLs), a variable resistance element is used as a memory element. With the CBRAM, which relies on the variance in the ohmic value of the memory cells, compared with the charge-storage memory cells, the retention of memory is seldom a problem. Therefore, high-capacity CBRAM with cross-point memory cells is a possibility. In particular, CBRAM, as cross-point CBRAM, is anticipated. Metallic ions in the diffusion layer between two electrodes of CBRAM memory cells may diffuse out thus changing the ohmic value of the memory cells by controlling the current path connecting the two electrodes. Further, the CBRAM has rectification characteristics as well as variable resistance characteristics. In a cross-point non-volatile semiconductor device, generally, since a reverse bias voltage is applied to a non-selected memory cell upon read out, it is necessary to suppress a current from the non-selected memory cell. Thus, it is necessary to connect a rectifying element such as a diode to the memory cell in series. CBRAM memory cells have the function of rectification, so it is not necessary to connect the rectifier element. Therefore, the structure of CBRAM memory cells is simplified and high-capacity is possible.

However, when the memory cells are smaller than 10 nm in size, the diffusion of metallic ions makes the control of the current path more difficult. When the metallic ions diffuse excessively to the diffusion layer and if the memory cells alternate between ON and OFF states, the deviation of the switch may increase and the endurance of the switching angle may be weakened. If the size of the memory cells decreases, the metallic ions will be diffused excessively. In addition, the rectification characteristics are also deteriorated due to lower resistance in the rectification properties that will allow the reverse current to increase. For this reason, CBRAM with memory cells smaller than 10 nm in size that have good rectification and switching characteristics is worth pursuing.

DETAILED DESCRIPTION

Embodiments provide a CBRAM with memory cells having good rectification and switching characteristics.

In general, embodiments of the invention will be described with reference to the drawings. The drawings show the shape, dimensions and size of each element which may be different from the actual shape, dimensions and size; therefore, appropriate alterations within the scope of the invention can be made.

The CBRAM according to the embodiments includes WLs, a first electrode, an ion diffusion layer, a second electrode, and BLs. The WLs is made of conductive material and extend along the first direction. The first electrode is provided on the WL and is connected to the WLs. The ion diffusion layer has a high resistance and is provided on the first electrode on the other side of the WLs and is electrically connected to the first electrode. The second electrode is electrically connected to the ion diffusion layer and supplies metal into the ion diffusion layer if a positive voltage is applied to the first electrode. The bit line is provided on the second electrode on the other side of the ion diffusion layer, is connected to the second electrode, is made of conductive material, and extend along a second direction orthogonal to the first direction. The second electrode is made of metal supplied into the ion diffusion layer. The ion diffusion layer has a first region at the WLs side, and a second region into which metal is more difficult to diffuse relative to the first region, adjacent to the first region.

(First Embodiment)

Figure 1:
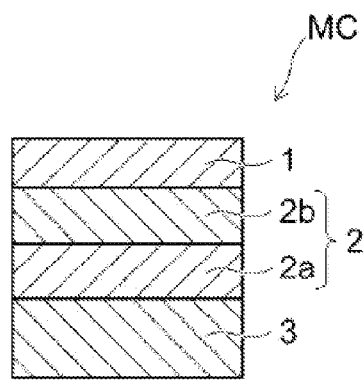
FIG. 1 is a sectional view of a CBRAM according to a first embodiment.
Figure 2:
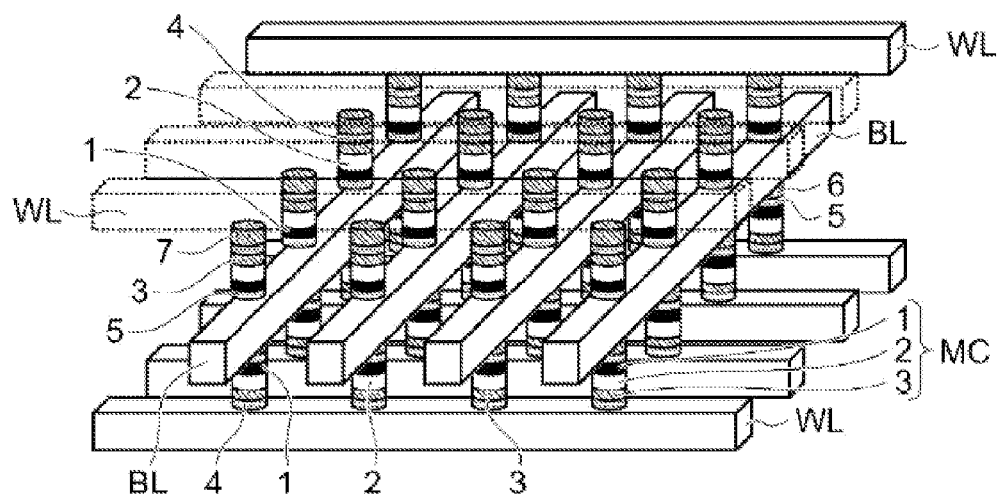
FIG. 2 is a perspective view of the CBRAM of the first embodiment.
Figure 3A:
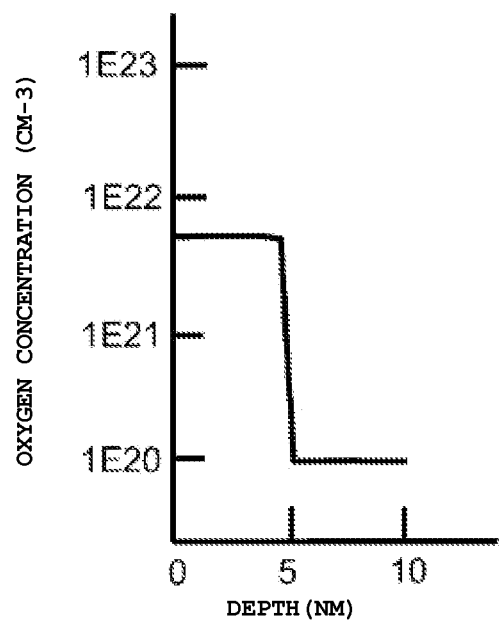
FIG. 3A shows a distribution of oxygen concentration in the ion diffusion layer of the CBRAM of the first embodiment.
Figure 3B:
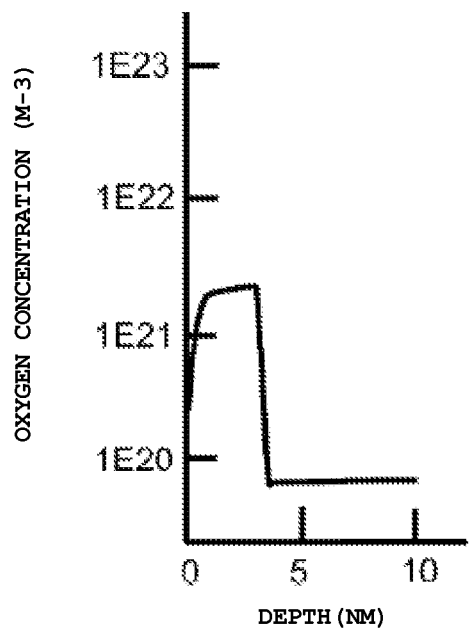
FIG. 3B shows a distribution of oxygen concentration in the ion diffusion layer of a first modified example of the CBRAM of the first embodiment.
Figure 3C:
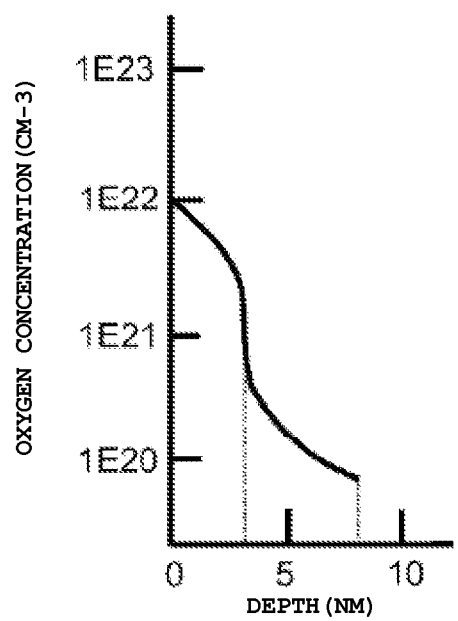
FIG. 3C shows a distribution of oxygen concentration in the ion diffusion layer of a second modified example of the CBRAM of the first embodiment.
Figure 4A:
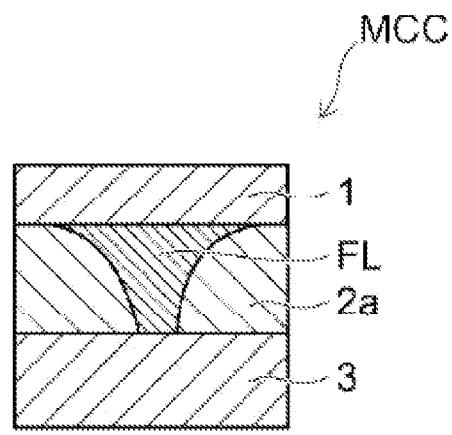
FIG. 4A and FIG. 4B are the sectional views of a CBRAM according to a comparison example.
Figure 4B:
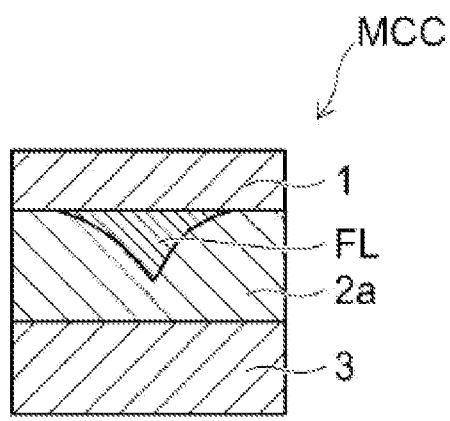
Figure 5:
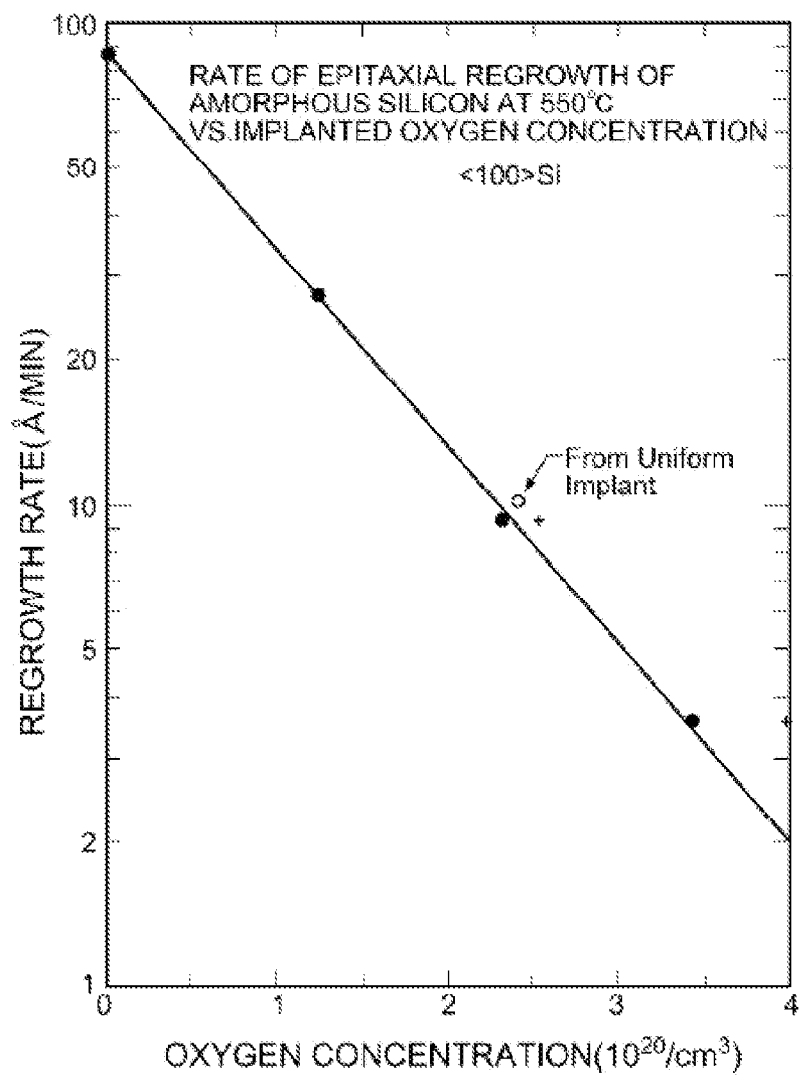
FIG. 5 is a graph showing the dependence of oxygen concentration on recrystallization of amorphous silicon.

A CBRAM of the first embodiment of the invention is explained with reference to FIG. 1 to FIG. 5. FIG. 1 shows a diagram of a non-volatile semiconductor memory cell according to the first embodiment. FIG. 2 is a perspective view of the CBRAM of the first embodiment. FIG. 3A shows a distribution of oxygen concentration in the ion diffusion layer of the CBRAM of the first embodiment. FIG. 3B and FIG. 3C show distributions of oxygen concentration in the ion diffusion layer of first and second modified examples of the CBRAM of the first embodiment. FIG. 4A and FIG. 4B are the sectional views of a non-volatile semiconductor memory according to a comparison example. FIG. 5 is a graph showing the dependence of oxygen concentration on recrystallization of amorphous silicon.

As shown in FIG. 1, the memory cells (MCs) of the CBRAM according to this embodiment has an ion diffusion layer 2 on a lower electrode 3. The ion diffusion layer 2 is electrically connected to an upper part of the lower electrode 3. The lower electrode 3 is made of conductive material, such as N-conductivity type polysilicon although P-conductivity type polysilicon or metallic materials may also be used.

When using metallic materials, metallic elements whose ions are hard to diffuse to the ion diffusion layer 2 are preferred. As described below, when the ion diffusion layer 2 includes silicon (Si), metallic materials such as titanium nitride (TiN), molybdenum (Mo), and tantalum (Ta) may be used.

It is preferable to use a resistive bed in the ion diffusion layer 2, such as a-Si composed of silicon without either N-conductivity type impurity or P-conductivity type impurity. The ion diffusion layer 2 may be polysilicon instead of amorphous silicon. FIG. 3A shows the oxygen concentration in the ion diffusion layer 2 along the vertical direction. The ion diffusion layer 2 includes a first region 2a of low oxygen concentration near the lower electrode 3 and a second region 2b of high oxygen concentration near the upper electrode 1. The oxygen concentration in the first region 2a is about $1 \times 10^{20}/cm^3$ or less. For example, it is formed as a non-doped layer where oxygen has not been added intentionally. The oxygen concentration in the second region 2b is about $8 \times 10^{21}/cm^3$. The thickness of the second region 2b is 2 nm to 10 nm, e.g., 5 nm. The thickness of first region 2a is 2 nm to 10 nm, e.g., 5 nm.

The upper electrode 1 is electrically connected to the ion diffusion layer 2. In this embodiment, the upper electrode 1 includes silver (Ag) which is hard to fuse with silicon, so when the voltage is applied to the amorphous silicon, diffusion into the amorphous silicon is made easier. The metal that diffuses into the ion diffusion layer may be other than Ag. When the ion diffusion layer 2 is composed of silicon, copper (Cu), aluminum (Al), cobalt (Co), nickel (Ni), and titanium (Ti) may be used as the upper electrode.

The memory cell array is shown in FIG. 2. The multiple WLs extending along any one direction intersect with the multiple BLs, which extend perpendicularly with respect to these WLs. There is a layer of insulation film which is not illustrated in the drawings.

The MCs pass through holes in the layer of insulation film at the cross section of the WLs and BLs; the lower electrode 3 is electrically connected to the WLs, while the upper electrode 1 is electrically connected to the BLs.

The MCs may be set on any of the multiple WLs. The lower electrode 3 is connected to the WLs through a wiring layer. The upper electrode 1 of the MCs is connected to the top through a wiring layer to where the BLs are located.

For the other memory cells MCs, the arbitrary bit line BL in the first bit line wiring layer is shown in a top and bottom reverse shape, since the memory cell on the word line WL is arranged in the first word line wiring layer and the upper electrode 1 is connected to the bit line BL. The lower electrode 3 is connected to the lower electrode 3 of the memory cell by means of an electrical connection. The word line WL is constituted by the multiple word line having a second bit line wiring layer in the same plane.

The structure between the first word line wiring layer and the second word line wiring layer includes the memory cell array for the non-volatile semiconductor memory device according to this embodiment. The selection, writing, reading and removal of the memory cell MC information is carried out by selecting the bit line BL and the word line WL.

Next, the memory holding action related to the memory cell MC is explained. In order to explain the relevant effects of this embodiment, the memory holding action relating to a memory cell MC of a comparison example is explained first. As shown in FIG. 4, the ion diffusion layer 2a of the memory cell MC of the comparison example is partially similar to the low oxygen concentration region 2a of the first region in the diffusion layer 2 of this embodiment. For example, the thickness of the ion diffusion layer 2a of memory cell MC relative to the comparison example is the same as that of the diffusion layer of this embodiment, i.e., 10 nm. The concentration of oxygen in the ion diffusion layer 2a of memory cell MC relative to the comparison example is the same as that in the first region 2a of the relevant diffusion layer of this embodiment. Moreover, the other structures of the non-volatile semiconductor memory device relative to the comparison example do not show substantial differences when compared to those of the non-volatile semiconductor memory device relative to this embodiment.

The upper electrode 1 of the memory cell MC is provided with a positive voltage through the bit line BL, and silver ions are diffused to the ion diffusion layer 3 from the upper electrode 1 to the lower electrode 3. In the interface of the upper electrode 1 and the ion diffusion layer 2a, the silver ions start to diffuse into the ion diffusion layer, away from the part where the concentration of the silver ion is increased.

If the voltage is increased, the filament FL of silver starts to extend from the upper electrode 1 to the lower electrode 3. When the voltage is excessive to the threshold value $V_{th}$, the front end of the filament FL will reach the lower electrode 3 (as shown in FIG. 4A) to form the current circuit from the upper electrode to the lower electrode 3. Therefore, the ion diffusion layer 2a will be in a low-resistance state, and a current will flow from the upper electrode 1 to the lower electrode 3 and the memory cell MC will be in the state of "ON". The information has been written into the MC, which is equal to the value [1] and the memory can be maintained at the state of "ON" even when the voltage is controlled to be 0.

Subsequently, the upper electrode 1 and the lower electrode 3 of the memory cell MC are provided with a negative voltage and the silver ions then diffuse from one side of the lower electrode 3 to the upper electrode 1, as shown in FIG. 4B. If a voltage of reverse bias is increased, the filament FL will shrink towards the upper electrode. As the result, the front end of the filament FL leaves the upper part of the lower electrode 3, and the current is blocked, such that the memory cell MC powered "OFF".

However, the majority of the filament will remain in the ion diffusion layer 2a when the reverse bias voltage increase is small. Therefore, the positive bias voltage increase shall be directly applied from the front of the filament to the upper part of the lower electrode 3 to power the memory cell MC "ON". Therefore, the memory MC is controlled in the state of "ON" when the voltage increase is small, i.e., the signal voltage increase is small, and the rectification characteristics thereof will be maintained. Here, the filament will be pulled back to the onside of the upper electrode 1 when a stronger voltage of inverse bias is applied to the memory cell MC, the filament will basically disappear in the ion diffusion layer 2a, the resistance in the ion diffusion layer 2a will be high, and the memory cell MC will be controlled at the state of "OFF". In the case of information removal from the memory cell, the state is equivalent to the value [0]. In the "OFF" state, the positive bias is in the "OFF" state. When the voltage of the positive pn node cannot reach the threshold voltage $V_{th}$, the MC will not be switched to the "ON" state when the ion diffusion layer 2a is controlled in a state of low voltage.

Generally, the cross-point memory cell MC selected will be supplied with the forward bias voltage such as a small signal voltage, when the memory cell bit line BL and word line WL read out the data in the selected memory cell array. A current flow through the memory cell MC is detected to read out the data. The non-selected memory cell MC, to which the non-selected bit line BL and the non-selected word line WL are connected, is provided with a voltage that is equal to that of reverse bias. Then, the waste currents of the non-selected memory cell flows, so that consumed power increases. Further, the waste current is the reason for the failure of the memory cell.

Therefore, a cross-point type memory cell array will be provided with a memory cell and in-line rectifier that prevents energization in the case of any reverse bias of the memory cell. However, the CBRAM with the rectifying characteristics described above in the comparison example and this embodiment does not need an in-line connection for the rectifier of the memory cell.

Switching between the "ON" state and the "OFF" states of the CBRAM is intended to improve the characteristics of the switch and creates a filament with enhanced metal ion diffusion in the ion diffusion layer 2. The upper electrode 1 of the memory cell MC, relative to the comparison example, uses silver and amorphous silicon which will not add impurities into the ion diffusion layer 2. Based on the silver ions, which are easy to diffuse into the amorphous silicon, the filament is easy to form and the switching characteristics are good.

However, when the bit cell of the memory cell is miniaturized, the rectifying characteristics mentioned above will become poor in the case of a strong filament. In the case of excess silver ions in the side of the lower electrode 3, and contact area between the filament FL and the lower electrode 3 is too large. It is difficult for the end of the filament FL to leave the upper surface of the lower electrode 3 in case of small reverse bias voltage. Then, the power consumption will be increased, the memory cell will deteriorate.

In this embodiment, the degree of diffusion of the silver ions in the ion diffusion layer is controlled in order to maintain the good switching characteristics as well as the rectifying characteristics. The explanation for this embodiment with regard to the control of the diffusion of silver ions is as follows.

FIG. 5 is from the E. F. Kennedy technical paper "Influence of $O^{16}$, $C^{12}$, $N^{14}$, and noble gases on the crystallization of amorphous Si layers" (Journal of Applied Physics, Vol. 28, No. 10, October 1977). The relation between oxygen concentration in the amorphous silicon and recrystallization speed of amorphous silicon at 550° C. is shown in FIG. 5. As shown in FIG. 5, it is found that the higher the oxygen concentration is in the amorphous silicon, the more rapidly the recrystallization speed of the amorphous silicon decreases. In order to recrystallize the amorphous silicon at the correct recrystallization speed, the silicon atoms in the amorphous silicon must be diffused to the most suitable position. If the recrystallization speed is fast, the Si in the amorphous silicon will diffuse easily. However, if the concentration of oxygen in the amorphous silicon is high, the Si atoms in the amorphous silicon will not diffuse as easily.

According to the information above, the result is expected to be the same for silicon atoms in the presence of metal atoms in amorphous silicon and polysilicon; the degree of diffusion of metal atoms in amorphous silicon and polysilicon is controlled by the oxygen concentration. According to FIG. 5, when the oxygen concentration in amorphous silicon is $1 \times 10^{20}/cm^3$, the recrystallization speed is about half of the re-crystallization speed in amorphous silicon without the addition of oxygen, e.g., the rate of diffusion of the silicon atom is about twice that when the oxygen concentration is $1 \times 10^{20}/cm^3$; when the oxygen concentration in amorphous silicon is $2 \times 10^{20}/cm^3$, the recrystallization speed is 1/10th of the recrystallization speed in amorphous silicon without the addition of oxygen, e.g., the rate of diffusion of the silicon atom is about 1/10th that when the oxygen concentration is $2 \times 2^{20}/cm^3$. That is, the diffusion of the silicon atoms is suppressed to about one-tenth when the oxygen concentration is $2 \times 10^{20}/cm^3$.

To sum up, in order to inhibit the diffusion of metal ions in amorphous silicon and polysilicon, the oxygen concentration in the amorphous silicon and polysilicon is controlled to a level greater than $2 \times 10^{20}/cm^3$. However, the atomic number density of silicon is $5.0 \times 10^{22}/cm^3$ and the atomic number density of de-acidified silicon is $6.6 \times 10^{22}/cm^3$. The density of silicon dioxide atoms is $6.6 \times 10^{22}/cm^3$ (the density of silicon atoms is $2.2 \times 10^{22}/cm^3$, and the density of oxygen atoms is $4.4 \times 10^{22}/cm^3$). For materials except silicon, for example, when the atomic number density of oxygen is more than $4.0 \times 10^{22}/cm^3$, the membrane in amorphous silicon and polysilicon is mostly the same as that of the de-acidified silicon, which means that the property of ion diffusion layer is non-existent, and furthermore, the compactness of the metal electrode cannot be guaranteed. In this way, the concentration of oxygen should be controlled to be below $4.0 \times 10^{22}/cm^3$.

In addition, the oxygen concentration in amorphous silicon and polysilicon should be controlled to be below $1 \times 10^{20}/cm^3$ in order to enhance the diffusion of the metal ion; the oxygen concentration in amorphous silicon and polysilicon is expected to be controlled to be below $1 \times 10^{19}/cm^3$ for the diffusion of the metal ion; under these conditions, the re-crystallization speed is basically the same as the re-crystallization speed in amorphous silicon without the addition of oxygen element (when the oxygen concentration in FIG. 5 is 0). Therefore, the diffusion of metal ion is basically prevented by the control based on the oxygen concentration.

With regard to the memory cell MC of a non-volatile semi-conductor memory device according to the second example of this embodiment; its ion diffusion layer 2 is created by the first region 2a and the second region 2b. The formation of the first region 2a is to make the oxygen concentration $1 \times 10^{20}/cm^3$, so that it promotes the diffusion of the silver ions supplied by the upper electrode 1, while on the opposite side, the purpose of the formation of the second region 2b is to make the oxygen concentration reach $5 \times 10^{21}/cm^3$; the diffusion of the silver ions supplied by upper electrode 1 thus has been restricted.

Therefore, in the non-volatile semiconductor memory device associated with this embodiment, when information is written into memory cell (MC) and the upper electrode 1 is provided with voltage, the diffusion of the silver ions from the upper electrode 1 of the second region 2b to the first region 2a is controlled. Thus, in comparison with the memory cell (MC) associated with the comparison example, the silver ions in the ion diffusion layer 2 of the memory cell (MC) associated with this sample are not over supplied. Putting it another way, the first region 2a in the ion diffusion layer 2 associated with this embodiment enhances the diffusion of silver ions when the oxygen element concentration is low. The filament FL is likely to be excessive due to the excessive supply of silver ions. However, the diffusion of the silver ions fed by the upper electrode 1 is controlled in the second region 2b, and the supply of the silver ions from the upper electrode 1 to the first region 2a is also controlled, so that the excessive supply of the silver in the first region 2a to the filament FL is controlled. In the first region 2a, the correct amount of silver ions is supplied from the upper electrode 1 and diffused rapidly, the silver filament FL is formed properly, and the connection and disconnection between the front end of the silver filament FL and the upper surface of the lower electrode 3 takes place rapidly. Thus, in comparison with the memory cell (MC) associated with the comparison example, the memory cell (MC) associated with this embodiment has good switching characteristics, good rectifying characteristics, and the good switching characteristics endure a longer time.

In contrast, the ion diffusion layer 2a in the memory cell MC relative to the comparison example is constituted of non-doped amorphous silicon and so the silver-based filament FL will be rapidly extended to the lower electrode 3 while writing. Therefore, the control of the external voltage for stopping the extension of the filament FL when the top end of the filament FL has reached the lower electrode 3, is difficult when comparing it with the memory cell MC according to this embodiment. As a result, the lower end of the filament FL is in excessive contact with the lower electrode 3 in the memory cell MC relative to the comparison example. For example, the area between the contact section of the filament FL and the lower electrode 3 will be excessively larger when the filament FL is extended for one step along the direction of the plane that is parallel to the top part of the lower electrode 3.

In the case of excessive contact between the lower end of the filament FL and the lower electrode 3, the filament FL will not be readily disconnected from the lower electrode 3 even when the memory cell MC is provided with a reverse voltage. In other words, when compared with the memory cell MC according in this embodiment, the rectifying characteristics of the memory cell MC relative to those of the comparison example are difficult to achieve and the difference between the rectifying characteristics of the memory cells MCs is great. In addition, an increase in the reverse current of the memory cell MC may result.

The ion diffusion layer of the memory cells MCs mentioned above includes a first region "a" of low oxygen concentration and a second region "b" of high oxygen concentration, and therefore the non-volatile semiconductor memory device according to this embodiment shows good rectifying characteristics and durable power distribution characteristics.

This embodiment has been explained when the lower electrode 3 is n-conductivity type polysilicon. Here, the memory cell MC is provided with a reverse bias voltage, the depletion layer is diffused from the lower electrode 3 and at the interface of the ion diffusion layer 2 and the lower electrode 3; therefore the lower end of the filament FL and the lower electrode 3 will be disconnected from the power more effectively. Thus, the rectifying characteristics of the non-volatile semiconductor memory device according to this embodiment will be better. In order to use the lower electrode 3 as an n-conductivity type semiconductor, in case of n-conductivity type polysilicon, the n-conductivity type impurity concentration should be more than $1 \times 10^{18}/cm^3$.

When the lower electrode 3 is a p-conductivity type polysilicon, and the memory cell MC is provided with a reverse bias voltage, the depletion layer will not be formed within the lower electrode 3. Therefore, compared with the situation where the lower electrode 3 is an n-conductivity type polysilicon, the rectifying characteristics of the memory cell MC are less, and the rectifying characteristics are generated when the filament FL is pulled back to one side of upper electrode 1, at a minimum. Thus, the effects mentioned above of the non-volatile semiconductor memory device according to this embodiment will be achieved even when the lower electrode 3 is p-conductivity type poly-silicon.

In addition, the lower electrode 3 may also be made from metal. Here, the lower electrode 3 may be formed of metallic material, which is difficult to be thermally diffused into the ion diffusion layer. For example, if the ion diffusion layer is silicon, the metal can be titanium nitride (TiN), molybdenum (Mo), tantalum (Ta) and so on.

In this embodiment, in order to control the diffusion of metal ions in the ion diffusion layer 2, the oxygen concentration of the ion diffusion layer 2b in the second region must be higher than that of the ion diffusion layer 2a in the first region. However, the oxygen can be replaced by nitrogen or carbon. The technical papers written by E. F. Kennedy, et al. mentioned that the recrystallization speed of the amorphous silicon when using nitrogen instead of oxygen, is the same as that of the amorphous silicon using oxygen at the same concentration. In other words, substantially identical effects on the control of the diffusion of the silver ions can be achieved even in the non-volatile semiconductor memory device with the ion diffusion layer 2 under the condition that the nitrogen concentration in the ion diffusion layer is the same as that of the oxygen concentration in the ion diffusion layer of this embodiment (as shown in FIG. 3A).

In addition, it is also mentioned that the recrystallization speed of the amorphous silicon including carbon instead of oxygen is 3times than that of the amorphous silicon using oxygen at the same concentration. In other words, substantially identical effects on the control of the diffusion of the silver ions can be achieved even in the non-volatile semiconductor memory device with the ion diffusion layer 2 under the condition that the carbon concentration in the ion diffusion layer is 3 times of that of the oxygen concentration in the ion diffusion layer according to this embodiment (as shown in FIG. 3A).

As mentioned above, the effects on the control of the diffusion of metal ions in the amorphous silicon or polycrystalline silicon not only depend on the concentration of oxygen in the film, but also depend on the concentration of nitrogen and carbon. Thus, the impurity concentration (hereinafter abbreviated as CNO concentration) to be considered refer to the sum of the oxygen concentration, nitrogen concentration and one-third of carbon concentration as shown in equation (1) below. The CNO concentration of the ion diffusion layer and the non-volatile semiconductor memory device with the same concentration profile as shown in FIG. 3A can achieve the same effects for the non-volatile semiconductor memory device of this embodiment.

$$\text{CNO concentration} = \text{oxygen concentration} + \text{nitrogen concentration} + \text{carbon concentration}/3 \quad (1)$$

In the amorphous silicon or polycrystalline silicon, the CNO concentration of the amorphous silicon or polycrystalline silicon should be $2 \times 10^{20}/cm^3$ and above in order to control the diffusion of the metal ions. However, the density of silicon atoms is $5.0 \times 10^{22} cm^3$, the density of silica atoms is $6.6 \times 10^{22}/cm^3$ (the density of silicon atoms is $2.2 \times 10^{22}/cm^3$, the density of oxygen atoms is $4.4 \times 10^{22}/cm^3$), the density of silicon nitride atoms is $9.6 \times 10^{22}/cm^3$ (the density of silicon atoms is $4.1 \times 10^{22}/cm^3$, and finally, the density of nitrogen atoms is $5.5 \times 10^{22}/cm^3$). In addition, the difference in the density of the carbon based on the amorphous or single crystal is large, but it is generally the same and even 3 times that of the density of silicon atoms. Even when the amorphous silicon or polycrystalline silicon includes material other than silicon, e.g. the density of the atoms of the element other than silicon is more than $4.0\times10^{22}/cm^3$ (80% of density for the silicon atoms) the function of the ion diffusion layer will not be achieved because the membranes of the amorphous silicon or polycrystalline silicon are basically the same as the impurity compounds contained therein (silica, silicon nitride, as well as silicon carbide or mixtures thereof). In addition, the adhesion of the metal electrode cannot be ensured. Thus, the best CNO concentration is $4.0\times10^{22}/cm^3$ or below.

For the purpose of promoting the diffusion of metal ions, the CNO concentration of the amorphous silicon or polycrystalline silicon should be $1\times10^{20}/cm^3$ and below. For the purpose of promoting the diffusion of metal ions, the more satisfactory condition is that the CNO concentration of the amorphous silicon or polycrystalline silicon be $1\times10^{19}/cm^3$ and below. Here, the recrystallization speed is basically the same, with the condition that the oxygen will be not added into the amorphous silicon intentionally (the oxygen concentration in FIG. 5 is zero). Therefore, the diffusion of metal ions is hardly affected by the control of oxygen concentration.

In this embodiment, the upper electrode 1 uses silver. However, in contrast with the lower electrode 3, the upper electrode 1 may also be constituted from the atoms of other metal elements when the upper electrode 1 is provided with a positive voltage and the metal ions are diffused from the upper electrode 1 into the ion diffusion layer. For example, the upper electrode may be constituted from Cu, Al, Co, Ni or Ti when the ion diffusion layer 2 is constituted from silicon.

The non-volatile semiconductor memory device for the first modified example of this embodiment is as follows. The ion diffusion layer 2 of the memory cell MC has the profile for the oxygen concentration as shown in FIG. 3B.

As shown in FIG. 3B, the ion diffusion layer 2 for the first modified example of this embodiment has the first region 2a of 7 nm thick in one side of lower electrode 3 and the second region 2b of 3 nm thick in one side of the upper electrode 1. In the second region 2b, at a point 1 nm below the surface of the ion diffusion layer 2, the oxygen concentration is increased to $2\times10^{20}$ to $2\times10^{21}/cm^3$, and the oxygen concentration at a point 3 nm below the surface of the ion diffusion layer 2 has a constant value of $2\times10^{21}/cm^3$. In addition, the oxygen concentration in the first region 2a adjacent to the second region 2b is at a constant value of $5\times10^{19}/cm^3$.

Even in the non-volatile semiconductor memory device for the first modified example of this embodiment, the oxygen concentration in the first region 2a of the ion diffusion layer 2 is $1\times10^{20}/cm^3$ and below, and therefore the diffusion of metal ions in the ion diffusion layer 2 will be promoted. The oxygen concentration in the second region 2b is higher than that in the first region ion diffusion layer a, i.e. $2\times10^{20}/cm^3$ and above, and the ion diffusion in the ion diffusion layer will be controlled. Therefore, the non-volatile semiconductor memory device for the first modified example of this embodiment is the same as with the non-volatile semiconductor memory device of this embodiment, and the rectifying characteristics and the durable power distribution characteristics are good. Moreover, compared with the oxygen concentration within the second region ion diffusion layer 2b, the oxygen concentration on the surface of the ion diffusion layer in the modified example is low. Therefore, compared with the memory cell of this embodiment, the adhesiveness of the ion diffusion layer 2 and upper electrode 1 in the memory cell of the modified example is high, and power failures such as electrode shedding and the like in the non-volatile semiconductor memory device of the modified example are controlled.

The non-volatile semiconductor memory device for the second modified example is as follows. In the non-volatile semiconductor memory device for the second modified example, the ion diffusion layer 2 of the memory cell MC has the profile for oxygen concentration as shown in FIG. 3C.

As shown in FIG. 3C, the ion diffusion layer 2 for the second modified example has the first region (2a) ion diffusion layer 2a of 5 nm thick in one side of the lower electrode 3 and the second region (2b) ion diffusion layer 2b of 3 nm thick in one side of the upper electrode 1. In the second region (2b) ion diffusion layer, at a point 3 nm below the surface of the ion diffusion layer 2, the oxygen concentration is decreased from $1\times10^{22}$ to $2\times10^{21}/cm^3$. In addition, in the first region (2a) near the second region (2b), in one side of lower electrode 3, the oxygen concentration is decreased from $5\times10^{20}$ to $5\times10^{19}/cm^3$. This concentration distribution, which shows a gradient towards the deep direction, can be formed by any of the following methods: by changing the film formation condition, the first region (2a) and second region (2b) in the process of film formation or by forming the first region (2a) and the second under certain formation conditions region (2b) and then the oxygen is diffused in the heating process.

Even in the non-volatile semiconductor memory device for the second modified example, the oxygen concentration in the first region (2a) of the ion diffusion layer 2 is $1\times10^{20}/cm^3$ and below, and therefore the diffusion of metal ions in the ion diffusion layer 2 will be promoted. The oxygen concentration in the second region (2b) ion diffusion layer is higher than that in the first region (2a) ion diffusion layer a, i.e. $2\times10^{20}/cm^3$ and above, and the ion diffusion in the ion diffusion layer will be controlled. Therefore, the non-volatile semiconductor memory device for the second modified example is the same as the non-volatile semiconductor memory device, and the rectifying characteristics and the durable power distribution characteristics are good.

Next, the manufacturing method of the non-volatile semiconductor memory device will be explained by FIG. 6 through FIG. 11. These respectively show the cross sections of main parts of the non-volatile semiconductor memory device of this embodiment.

Figure 6:
FIGS. 6-11 are sectional views of the CBRAM of the first embodiment during manufacture.

Although the diagrams are omitted, the control parts are formed by forming the memory cell array on the silicon plate through the MOSET (Metal Oxide Semiconductor Field Effect Transistor), the contact layer and the like. In order to insulate these from the upper part, interlayer dielectric films 9 are formed on the control parts. The interlayer dielectric film 9, such as silicon oxide, can be replaced with silicon nitride or acid silicon nitride in case of the existence of an insulator. As shown in FIG. 6, the surface of the interlayer dielectric film 9 is provided with a word line WL prepared from tungsten (W) and other metals by means of a damascene process, wherein the interlayer dielectric film may be conductive polysilicon, in the case that the word line WL is a conductive material. The first word line wiring layer is constituted by extending inwards the principal plane of the word line WL in the form of a stripe and arranging the principal plane along the horizontal direction in several modes.

Figure 7:
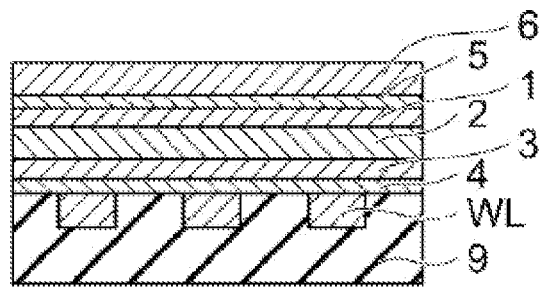

Next, the resistor 4, lower electrode 3, ion diffusion layer 2, upper electrode 1, resistor 5, and contact metal 6 for the bit line of the maximum data transmission are formed in order by covering all the surfaces of the interlayer dielectric films 9 and all the multiple word lines WLs, as shown in FIG. 7, wherein the resistor 5 can be constituted by ruthenium (Ru), titanium (Ti), tantalum (Ta), tungsten (W), hafnium (Hf), or aluminum (Al); the resistor 4 is used for controlling the diffusion of the control word line WL in the lower electrode 3; and there is no need to use the resistor 4 in the case where the word line WL is not formed and there is no diffusion problem in the case of the lower electrode 3.

For example, a film is formed from the amorphous silicon by taking silane ($SiH_4$) as the main raw material and using a plasma CVD method, to form the ion diffusion layer 2. The first region 2a in the electrical contact side of the ion diffusion layer 2 to the lower electrode 3 has a low oxygen concentration region 2a, and the second region 2b in the electrical contact side of the same to the upper electrode 1 has a high oxygen concentration region 2b, wherein the high oxygen concentration region 2b is used for supplying oxygen to nitrous oxide ($N_2O$), nitrogen oxide (NO), carbon dioxide ($CO_2$) and the like in the film-forming process of the amorphous silicon. In addition, the impurity other than those are not supplied to form the high oxygen concentration filed 2b. In the case of using the oxygen as mentioned above, although the nitrogen or carbon simultaneously oxidized in the amorphous silicon, the effect of the nitrogen or carbon is almost negligible as the efficiency thereof in the amorphous silicon is lower by about two decimal places when compared with that of oxygen. In the case of the concrete representation in the first region 2a, the film of amorphous silicon is formed by means of non-oxidation. In the case of the deliberate presence of oxygen in the first region 2a, the film of amorphous silicon is formed as the material supplied therein is less than that of the second region 2b, and therefore the low oxygen concentration region 2a in the first region 2a is formed. Due to the use of the oxygen as outlined above, the concentration of oxygen in the amorphous silicon may be controlled to a large extent. Specifically, the maximum concentration of oxygen in the amorphous silicon may reach $3\times10^{22}/cm^3$.

The upper electrode 1 is made of silver, and resistor 5 and resistor 4 are made of the same material. In the design, attention must be paid to ensure that the upper electrode 1 and the resistor 5 are prevented as far as is possible from mixing with the contact metal 6 for the bit line of maximum data transmission. The contact metal 6 for the bit line of maximum data transmission is constituted by metallic tungsten. In the design, the favorable electrical connection environment between the contact metal 6 and the bit line BL of the maximum data transmission formed behind it must be considered. The contact metal 6 for the bit line of maximum data transmission shall be a conductive material, and therefore it can be either metal or poly-silicon.

Figure 8:
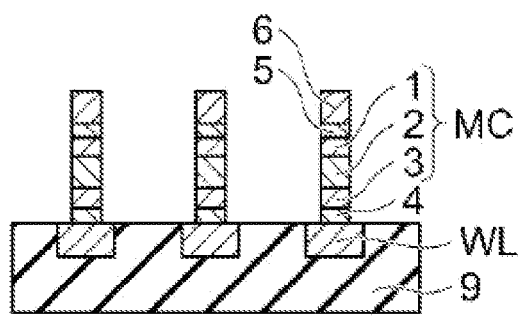

Next, the contact metal 6 for the bit line of maximum data transmission, resistor 5, upper electrode 1, ion diffusion layer 2, lower electrode 3 and resistor 4 formed by means of RIE are engraved with the film which is not shown in the process, FIG. 8. Therefore, each word line WL of the first word line wiring layer will be provided with a columnar structure for the laminated body of the resistor 4, lower electrode 3, ion diffusion layer 2, upper electrode 1, resistor 5 and contact metal 6 for the bit line of maximum data transmission. The columnar structure is separated into several parts through the direction extended along the word line WL. The columnar structure includes a memory cell MC composed of lower electrode 3, ion diffusion layer 2 and upper electrode 1. The several columnar structures can form the first memory cell layer. The columnar structure is powered on through the word line WL in the first word line wiring layer formed together with the bottom resistor 4.

Figure 9:
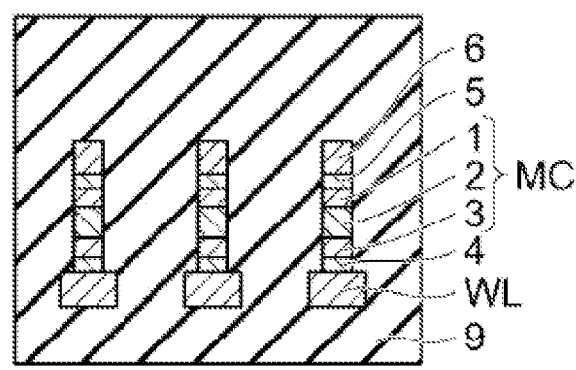

Next, the interlayer dielectric films 9 are formed by filling the insulating materials between the several columnar structures, as shown in FIG. 9. The interlayer dielectric films 9 thus formed cover the columnar structures mentioned above.

Then, the upper part of the interlayer dielectric film 9 will be flattened by means of CMP method. The trench which is not shown in the drawing is formed by means of the RIE method while placing the contact metal 6 for the bit line of the maximum data transmission on the surface of the interlayer dielectric film 9 through the mask (again not shown in the drawing) and extending the same along the intersection of the word line WL.

Figure 10:
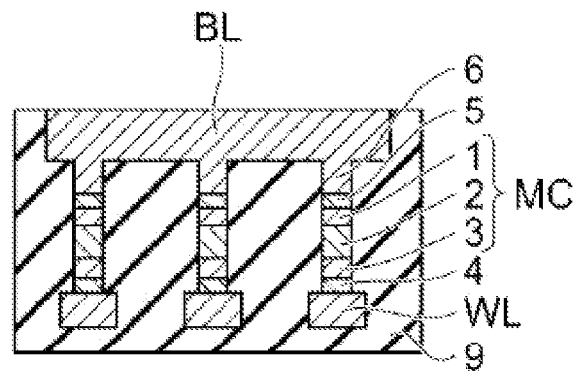

After all these stages, the maximum data transmission speed line BL is formed by means of damascene as the filling for the trench of the interlayer dielectric film 9, as shown in FIG. 10. Therefore, several maximum data transmission speed line BLs powered through the contact metal 6 for the line of maximum data transmission speed, are formed in the first word line wiring layer and in the same plane by extending along the intersecting of word line WL. The several maximum data transmission speed lines BLs constitute the first word line wiring layer.

Figure 11:
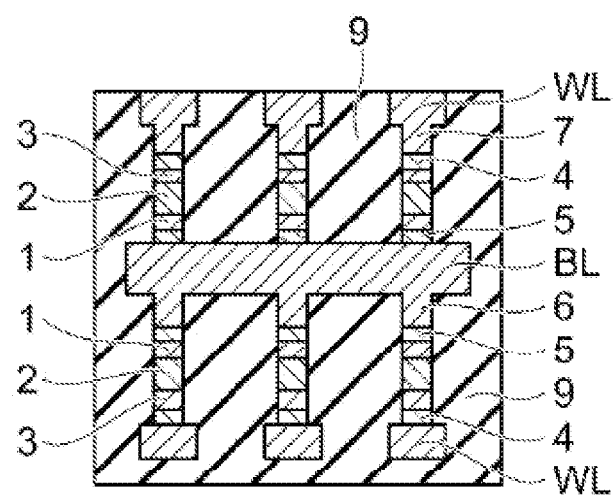

Next, the resistor 5, upper electrode 1, ion diffusion layer 2, lower electrode 3, resistor 4 and word line contact metal 7 are formed in one operation as the cover on the several maximum data transmission speed lines BLs and the interlayer dielectric films 9, as shown in FIG. 11. The lamination sequence of the upper electrode 1, ion diffusion layer 2 and lower electrode 3, which constituted the memory cell MC, is changed to the reverse sequence in relation to the same item in the first memory cell layer. Moreover, the lamination sequences of the low oxygen concentration region 2a and the high oxygen concentration region 2b in the ion diffusion layer 2 are also the reverse to those in the first memory cell layer. The word line contact metal 7 is made from tungsten and other metals. The normal energization of the word line contact metal 7 to the word line WL formed behind shall be designed. The word line contact metal 7 shall be a conductive material, and therefore it can be another conductive such as polysilicon.

Next, the word line contact metal 7, resistor 4, lower electrode 3, ion the diffusion layer 2, upper electrode 1 and resistor 5 are processed by means of the RIE method through the mask, (not shown in the drawing) as the formation for the several columnar structures in the first memory layer. Therefore, each maximum data transmission speed line BL in the first wiring layer of the maximum data transmission speed line can be provided with a columnar structure for the laminated body of the resistor 5, upper electrode 1, ion diffusion layer 2, lower electrode 3, resistor 4 and word line contact metal 7. The columnar structure is separated into several structures in the direction of the maximum data transmission speed line BL. The columnar structure includes a memory cell MC composed of lower electrode 3, ion diffusion layer 2 and upper electrode 1. The second memory cell layer is formed by a plurality of pillars. The structure is powered through the maximum data transmission speed line BL in the first wiring layer of the maximum data transmission speed line and the bottom resistor 5.

Next, the interlayer dielectric films 9 are formed on the interlayer dielectric films 9 in the first wiring layer of the maximum data transmission speed line with the several maximum data transmission speed lines BLs as the filling among the several columnar structures mentioned above, as shown in FIG. 9. The interlayer dielectric films 9 are covered on the upper parts of the several columnar structures mentioned above, and then the interlayer dielectric films 9 are flattened by means of the CMP method. The trench (not shown in the drawing) which extends in the same direction as the word line WL, is formed in the word line WL in the first word line wiring layer by means of the RIE method, using the film (not shown in the drawing) and reaching the word line contact metal 7 to the surface of the interlayer dielectric film 9.

Next, the word line WL is formed by means of a damascene process as the filling for the trench of the interlayer dielectric film 9, as shown in FIG. 11. In this way, numerous word lines WLs in the first word line wiring layer, the word lines WL extending in the same direction and powered through the word line contact metal 7 and first word line wiring layers, can be formed in the plane. These word lines WLs constitute the second word line wiring layer.

Thereafter the memory cell MC of the first word line wiring layer has a three-dimensional memory cell array and can provide the non-volatile semiconductor memory device related to the concrete representation due to the repeated operations of the production processes for the first memory layer, the first wiring layer of the maximum data transmission speed line, and the second memory layer.

In the production process, the second region 2b of the ion diffusion layer 2, related to the concrete representation, is the high oxygen concentration region, and the first region 2a is the low oxygen concentration region. The second region 2b is the high nitrogen concentration region and the first region 2a is the low nitrogen region, with silane $SiH_4$ as the main raw material, is regarded as the nitrogen raw material in the amorphous silicon film by the plasma CVD method, and can be replaced by ammonia ($NH_3$) water or nitrogen ($N_2$). Due to the application of the nitrogen raw material, the nitrogen concentration in the amorphous body can be controlled over a wide range, and the maximum nitrogen concentration of the amorphous body can be $4 \times 10^{22}/cm^3$.

Furthermore, in the production process, in that the second region 2b is the high carbon concentration region and the first region 2a is the low carbon region, methylsilane ($SiH_3CH_3$) or ethylene $C_2H_4$ can be used as the carbon raw material in the amorphous silicon film by the plasma CVD method, using silane $SiH_4$ as the main raw material. The carbon concentration in amorphous silicon can be controlled greatly due to the application of the carbon raw material, but in case of excessive carbon concentration in the amorphous silicon, the resistance formed by the precipitate of the carbon will be low, so that if the carbon concentration in the amorphous silicon is in line with $1 \times 10^{21}/cm^3$, there will be no problem about the low resistance of amorphous silicon.

As mentioned above, oxygen, nitrogen and carbon can be considered as impurities for controlling the diffusion of the metal ion in the ion diffusion layer 2. Oxygen and nitrogen are compared with the carbon, and in the case of a high concentration in the amorphous silicon, there is almost no problem about low resistance of amorphous silicon; furthermore, when compared with nitrogen, oxygen has good film forming efficiency due to high reactivity. However, from another point of view, when compared with oxygen, nitrogen has good concentration control property in the amorphous silicon.

(The Second Embodiment)

Figure 12:
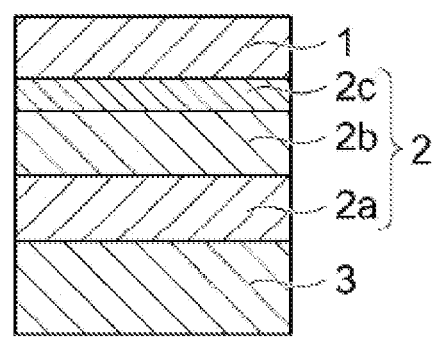
FIG. 12 is a sectional view of the CBRAM according to a second embodiment.

A non-volatile semiconductor memory device according to a second embodiment is explained in FIG. 12, which shows the cross-section of a non volatile semiconductor memory device according to the second embodiment. Furthermore, the reference order and symbol that are the same as the components of the first embodiment are omitted. The differences from the first embodiment are explained.

For the sectional structure of the memory cell MC of the non-volatile semiconductor memory device, as shown in FIG. 1, between the second region 2b and upper electrode 1 of the ion diffusion layer 2, a close auxiliary layer 2c is further provided. In this embodiment, the close auxiliary layer 2c, such as amorphous silicon, oxygen and nitrogen in the second region 2b, and the impurity formed by carbon, has a low concentration. The close auxiliary layer 2c, such as the first region 2a, has a low oxygen concentration, the thickness of 5 nm or less, preferably 2 nm or less. It is not desirable for the close auxiliary layer 2c to be too thick.

The memory cell MC of the nonvolatile semiconductor memory device according to the second embodiment and the second region 2b of the ion diffusion layer 2 are electrically connected with upper electrode 1 by the close auxiliary layer 2c. An oxygen concentration lower than that of the second region 2b is formed in the close auxiliary layer 2c, the oxygen concentration, nitrogen concentration and carbon concentration in the amorphous silicon are very low, along with good viscosity with the metal electrode, and therefore the non-volatile semiconductor memory device according to the second embodiment, the same with the nonvolatile semiconductor memory device according to the first embodiment, has good rectification characteristics, high durability, switching property and other properties, and is difficult to generate the non-contact situation caused by off electrode and the like in the memory cell MC, when compared with the non-volatile semiconductor memory device according to the first embodiment.

Moreover, as a part of the ion diffusion layer 2, after the formation of the second region 2b, the close auxiliary layer 2c can be used sequentially by the plasma CVD method of regarding $SiH_4$ as the main raw material. In the formation process of the close auxiliary layer 2c, compared with the oxygen raw material in the second region, the oxygen raw material should be reduced, or not put in deliberately.

(Third Embodiment)

Figure 13:
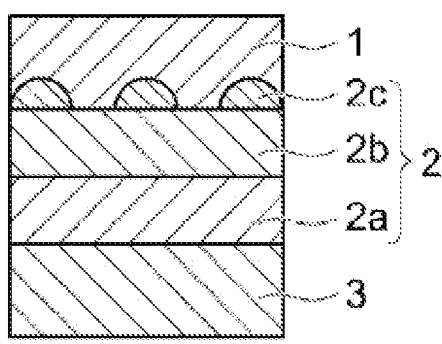
FIG. 13 is a sectional view of the CBRAM according to a third embodiment.

A non-volatile semiconductor memory device according to a third embodiment is shown in FIG. 13. FIG. 13 shows the cross-section of a nonvolatile semiconductor memory device according to the third embodiment. Furthermore, the reference order and those symbols that are the same as the components in the second embodiment are omitted. The differences from the second embodiment are explained here.

In the non-volatile semiconductor memory device shown in FIG. 12, the close auxiliary layer 2c does not have the same thickness in the horizontal direction, and with several parts protruding in the lamination direction, have the structure formed among the upper portions of the second region of the ion diffusion layer 2. The thickness of the rearmost part of the close auxiliary layer 2c formed by the protuberant parts is 5 nm and below, and 2 nm and below is desirable. The close auxiliary 2c formed by the protuberant parts, similar to the close auxiliary layer 2c related to the second embodiment, has the same oxygen concentration. Furthermore, in this embodiment, the close auxiliary layer 2c is composed of several protuberant parts separately, but it also has the structure formed by the protuberant parts on the layer with a uniform thickness. That is to say the structure can also be formed by connecting the bottoms of several protuberant parts and the adjacent protuberant parts. The above describes the difference relative to the non-volatile semiconductor memory device of the first embodiment.

Compared with the memory cell MC of the nonvolatile semiconductor memory device according to the second embodiment, the memory cell MC of the non-volatile semiconductor memory device according to the third embodiment is characterized by the contact area between upper electrode 1 and ion diffusion layer 2 being larger. Due to the protuberant structure of the close auxiliary layer 2c, a concave part is gradually formed on the surface of the ion diffusion layer 2 of upper electrode 1, and therefore the contact area between upper electrode 1 and ion diffusion layer 2 is increased; the situation of breaking away from the ion diffusion layer 2 of the upper electrode 1 is thereby difficult to occur. In FIG. 13, in the case of the close auxiliary layer 2c, composed of several separate protuberant parts, the upper electrode 1, close auxiliary layer 2c and second region 2b come together closely. In the case of the close auxiliary layer 2c and several adjacent protuberant parts connected to each other on the bottom, the upper electrode 1 and close auxiliary layer 2c come together closely.

As mentioned above, the non-volatile semiconductor memory device according to the third embodiment, and the non-volatile semiconductor memory device according to the second embodiment, have good rectification characteristics, high durability, switching property and other properties, and it is difficult to generate the non-contact situation caused by off electrode and the like in the memory cell MC, when compared with the non-volatile semiconductor memory device according to the second embodiment.

The manufacturing process is different due to the protuberant parts of the close auxiliary layer 2c, but the implementation is executed as follows: After the film formation in the second region 2b of the ion diffusion layer 2, the films are formed on multiple openings on the surface of the second region 2b. The surface of the second region 2b of the ion diffusion layer 2 is exposed at the opening. The opening can be strip, round or rectangular. Under the layer of film and on the surface of the second region 2b of the ion diffusion layer 2, e.g. the $SiH_4$ as the main raw material, and halogen elements such as (Cl) and the like are inserted, the plasma CVD is implemented at the same time, and therefore, the amorphous silicon is formed selectively at the opening of the mask. The film is peeled off, so that the upper electrode 1 will be formed on the close auxiliary layer 2c and the second region 2b. The film growing due to the selectivity of the silicon is also applied to silicon oxide or silicon nitride and etc. Generally speaking, compared with the silicon nitride, the silicon oxide is difficult to separate out from the silicon, so that the film growing due to the selectivity of the silicon is frequently formed by the silicon oxide.

While certain embodiments have been described, these embodiments have been presented by way of example only, and are not intended to limit the scope of the invention. Indeed, the novel embodiment described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the invention.

What is claimed is:

1. A non-volatile semiconductor memory comprising:
a word line extending in a first direction;
a first electrode connected to the word line electrically;
an ion diffusion layer with connected to the first electrode electrically;
a second electrode connected to the ion diffusion layer electrically and formed of a metal to be diffused into the ion diffusion layer when a positive voltage is supplied thereto; and
a bit line extending in a second direction perpendicular to the first direction, the bit line connected to the second electrode electrically,
the ion diffusion layer having a first region disposed on the first electrode and a second region disposed between the first region and the second electrode, the metal being more difficult to diffuse into the second region than into the first region.

2. The non-volatile semiconductor memory according to claim 1, wherein the second region has a higher concentration of impurities than the first region.

3. The non-volatile semiconductor memory according to claim 2, wherein the impurity contains at least one element selected from oxygen, nitrogen, and carbon.

4. The non-volatile semiconductor memory according to claim 2, wherein the first region is a substantially non-doped.

5. The non-volatile semiconductor memory according to claim 2, wherein the ion diffusion layer has a third region disposed between the second electrode and the second region, the third region having a lower concentration of impurities than the second region.

6. The non-volatile semiconductor memory according to claim 5, wherein the third region has protuberant parts at an interface between the second electrode and the third region.

7. The non-volatile semiconductor memory according to claim 5, wherein the third region is formed separately and arranged in parallel on the surface of the second region.

8. The non-volatile semiconductor memory according to claim 6, wherein the third region contains chlorine.

9. The non-volatile semiconductor memory according to claim 1, wherein the second electrode is formed of at least one element selected from Ag, Cu, Al, Co, Ni, and Ti.

10. The non-volatile semiconductor memory according to claim 1, wherein the first electrode is formed of an n-type polysilicon.

11. The non-volatile semiconductor memory according to claim 10, wherein the first electrode contains n-type impurities with a concentration $1\times10^{18}/cm^3$ or more.

12. The non-volatile semiconductor memory according to claim 1, wherein a concentration of impurities in the first region is $1\times10^{20}/cm^3$ or less.

13. The non-volatile semiconductor memory according to claim 1, wherein a concentration of impurities in the second region is $2\times10^{20}/cm^3$ or more.

14. The non-volatile semiconductor memory according to claim 1, wherein the ion diffusion layer is formed of amorphous silicon.

15. The non-volatile semiconductor memory according to claim 1, further comprising:
a second word line extending along the first direction;
a third electrode connected to the second word line electrically;
a second ion diffusion layer connected to the third electrode layer electrically; and
a fourth electrode connected to the second ion diffusion layer and the bit line electrically and formed of a metal to be diffused into the second ion diffusion layer when a positive voltage is applied to the fourth electrode,
the second ion diffusion layer having a fourth region disposed on the third electrode and a fifth region disposed between the fourth region and the fourth electrode, the metal being more difficult to diffuse into the fifth region than into the fourth region.

16. The non-volatile semiconductor memory according to claim 15, wherein the fifth region has a higher concentration of impurities than the fourth region.

17. The non-volatile semiconductor memory according to claim 16, wherein the second ion diffusion layer has a sixth region disposed between the fourth electrode and the fifth region, the sixth region having a lower concentration of impurities than the fifth region.

18. The non-volatile semiconductor memory according to claim 15, wherein the third electrode is formed of an n-type polysilicon.

19. The non-volatile semiconductor memory according to claim 15, wherein a concentration of impurities in the fourth region is $1\times10^{20}/cm^3$ or less.

20. The non-volatile semiconductor memory according to claim 15, wherein a concentration of impurities in the fifth region is $2\times10^{20}/cm^3$ or more.

* * * * *